US006973111B2

(12) United States Patent
Yamashita et al.

(10) Patent No.: US 6,973,111 B2
(45) Date of Patent: Dec. 6, 2005

(54) INJECTION LOCKING TYPE OR MOPA TYPE OF GAS LASER DEVICE

(75) Inventors: Toshio Yamashita, Hiratsuka (JP); Osamu Wakabayashi, Hiratsuka (JP)

(73) Assignees: Komatsu Ltd., Tokyo (JP); Gigiphoton Inc., Tokyo (JP)

( * ) Notice: Subject to any disclaimer, the term of this patent is extended or adjusted under 35 U.S.C. 154(b) by 0 days.

(21) Appl. No.: 10/348,154

(22) Filed: Jan. 21, 2003

(65) Prior Publication Data

US 2003/0142714 A1 Jul. 31, 2003

(30) Foreign Application Priority Data

Jan. 30, 2002 (JP) ............................ 2002-021255

(51) Int. Cl.[7] ................................................ H01S 3/22
(52) U.S. Cl. .......................................... 372/55; 372/58
(58) Field of Search ............................. 372/55–68, 18, 372/92, 103–109, 22, 38, 32, 34

(56) References Cited

U.S. PATENT DOCUMENTS

| | | | | |
|---|---|---|---|---|
| 4,313,092 A | | 1/1982 | Kaule | |
| 4,774,714 A | | 9/1988 | Javan | |
| 6,111,907 A | * | 8/2000 | Ozarski | 372/107 |
| 6,394,743 B1 | * | 5/2002 | Marsden et al. | 414/809 |
| 6,567,450 B2 | * | 5/2003 | Myers et al. | 372/55 |
| 6,625,191 B2 | * | 9/2003 | Knowles et al. | 372/55 |
| 6,721,344 B2 | * | 4/2004 | Nakao et al. | 372/55 |
| 6,795,474 B2 | * | 9/2004 | Partlo et al. | 372/57 |
| 2002/0141470 A1 | * | 10/2002 | Nakao et al. | 372/55 |

FOREIGN PATENT DOCUMENTS

| | | |
|---|---|---|
| JP | 50-145271 | 5/1949 |
| JP | 58-5363 | 6/1956 |
| JP | 49-2465 | 1/1974 |
| JP | 61-112670 U | 7/1986 |
| JP | 62-45856 U | 3/1987 |
| JP | 62-252980 A | 11/1987 |
| JP | 7-54857 B2 | 1/1988 |
| JP | 6-35486 Y2 | 9/1994 |
| JP | 2847648 B2 | 11/1998 |

OTHER PUBLICATIONS

A. Ershov et al; Feasibility of Highly Line-Narrowed $F_2$ Laser for 157 nm Microlithography; 2000 SPIE—The International Society for Optical Engineering; pp. 1-8.

* cited by examiner

*Primary Examiner*—Minsun Oh Harvey
*Assistant Examiner*—Tuan N. Nguyen
(74) *Attorney, Agent, or Firm*—Frishauf, Holtz, Goodman & Chick, P.C.

(57) ABSTRACT

An injection locking type or MOPA type of gas laser device which requires only a small installation area and allows easy maintenance. For this purpose, the laser device includes a seed laser unit (11) for exciting a laser gas inside a laser chamber (12) and oscillating seed laser light (21) and an amplifier (111) for exciting a laser gas inside an amplifying chamber (112) and amplifying pulse energy of the seed laser light (21), and allows the laser chamber (12) and the amplifying chamber (112) to be evacuated to the same side with respect to an optical axis of the seed laser light (21).

13 Claims, 15 Drawing Sheets

61
62
58
60
50
56
52
55
21
54
64
65
62

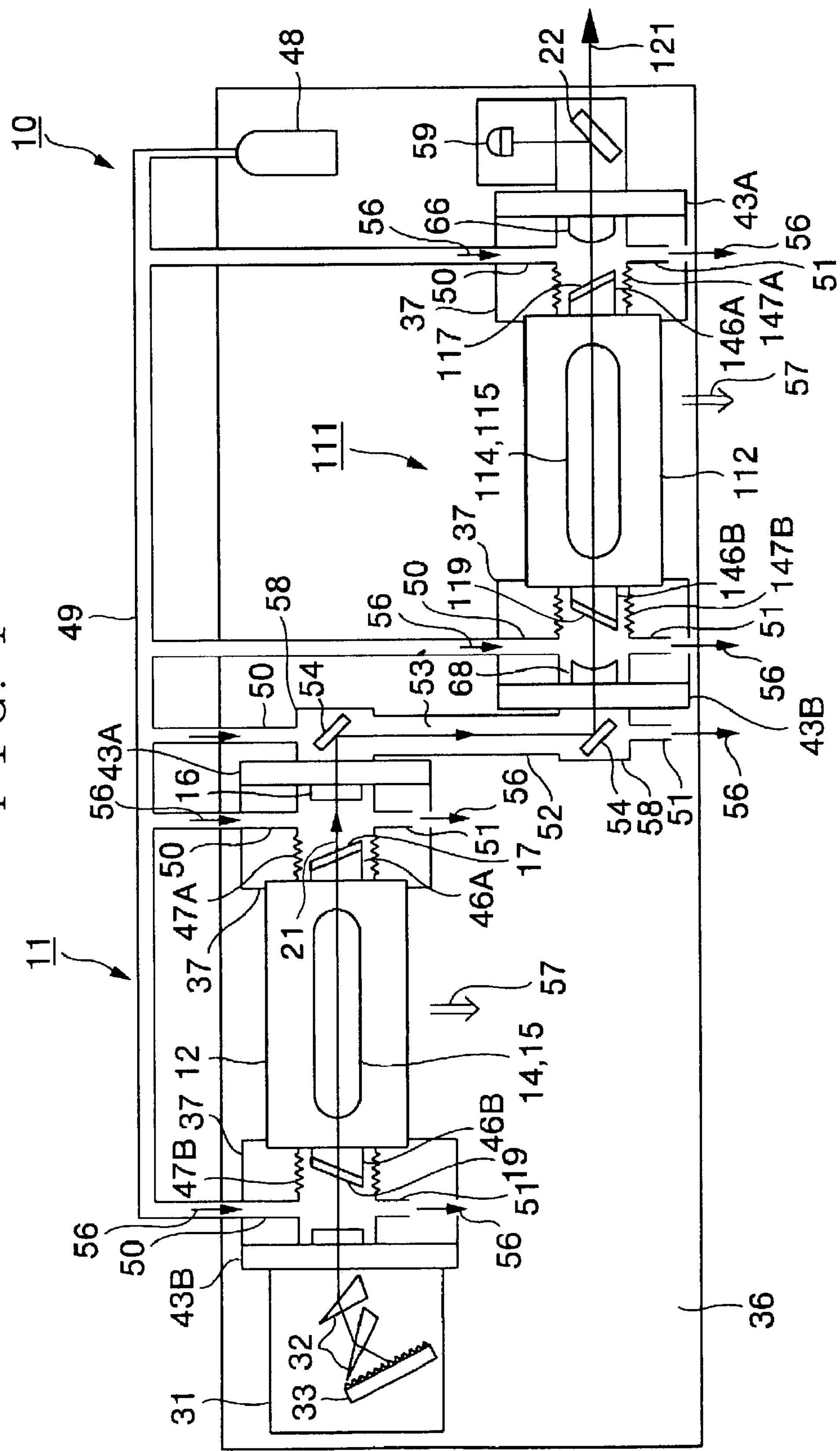
F I G. 1
10
11
111
48
49
59
22
121
43A
43B
56
66
50
51
37
117
119
146A
147A
146B
147B
57
114,115
112
58
54
53
68
52
16
17
21
46A
47A
46B
47B
12
14,15
19
31
32
33
36

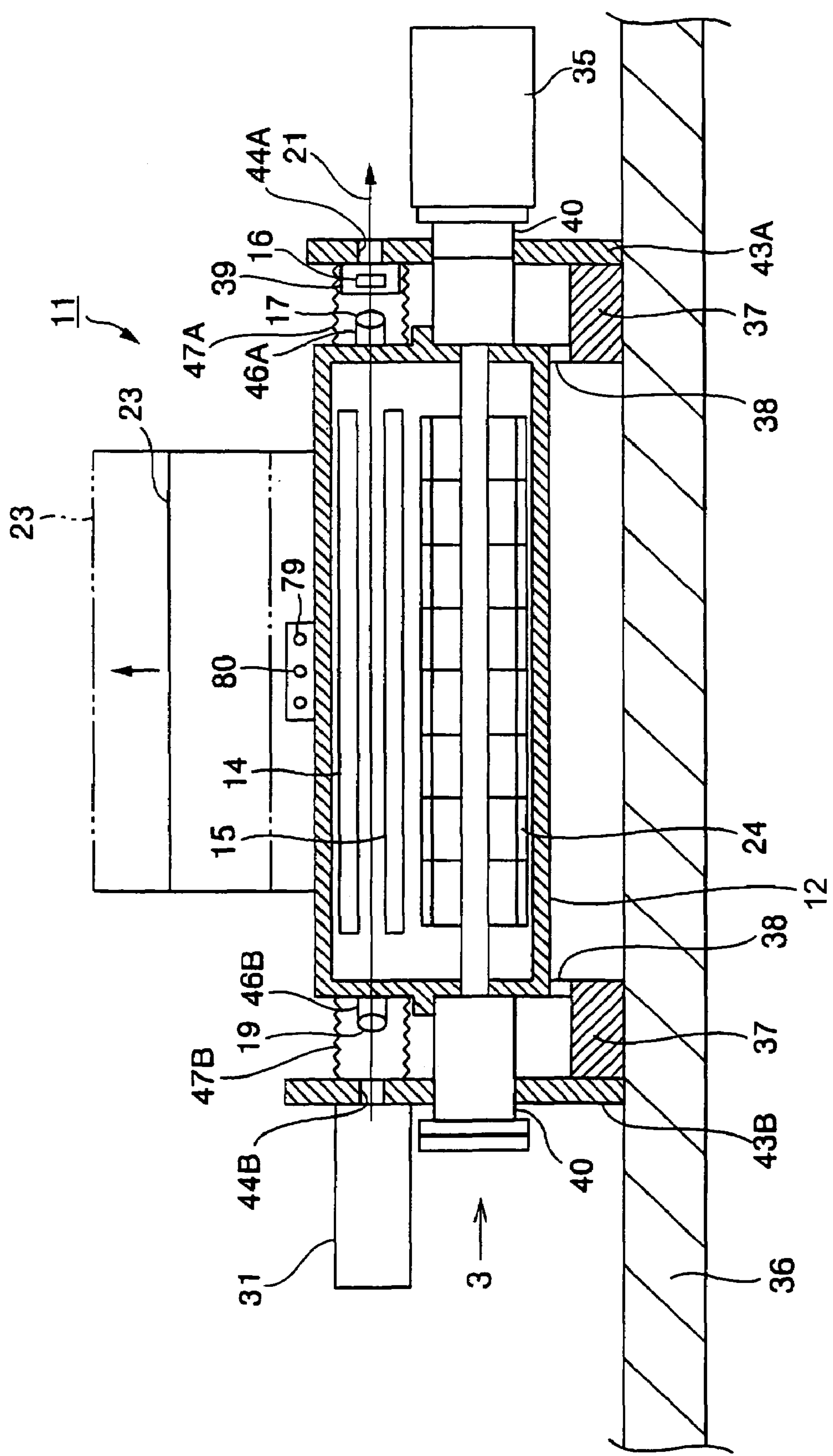
F I G. 2
11
23
23
35
21
44A
16
39
17
47A
46A
40
43A
37
38
79
80
14
15
24
12
38
46B
19
47B
37
44B
43B
40
31
3
36

F I G. 3
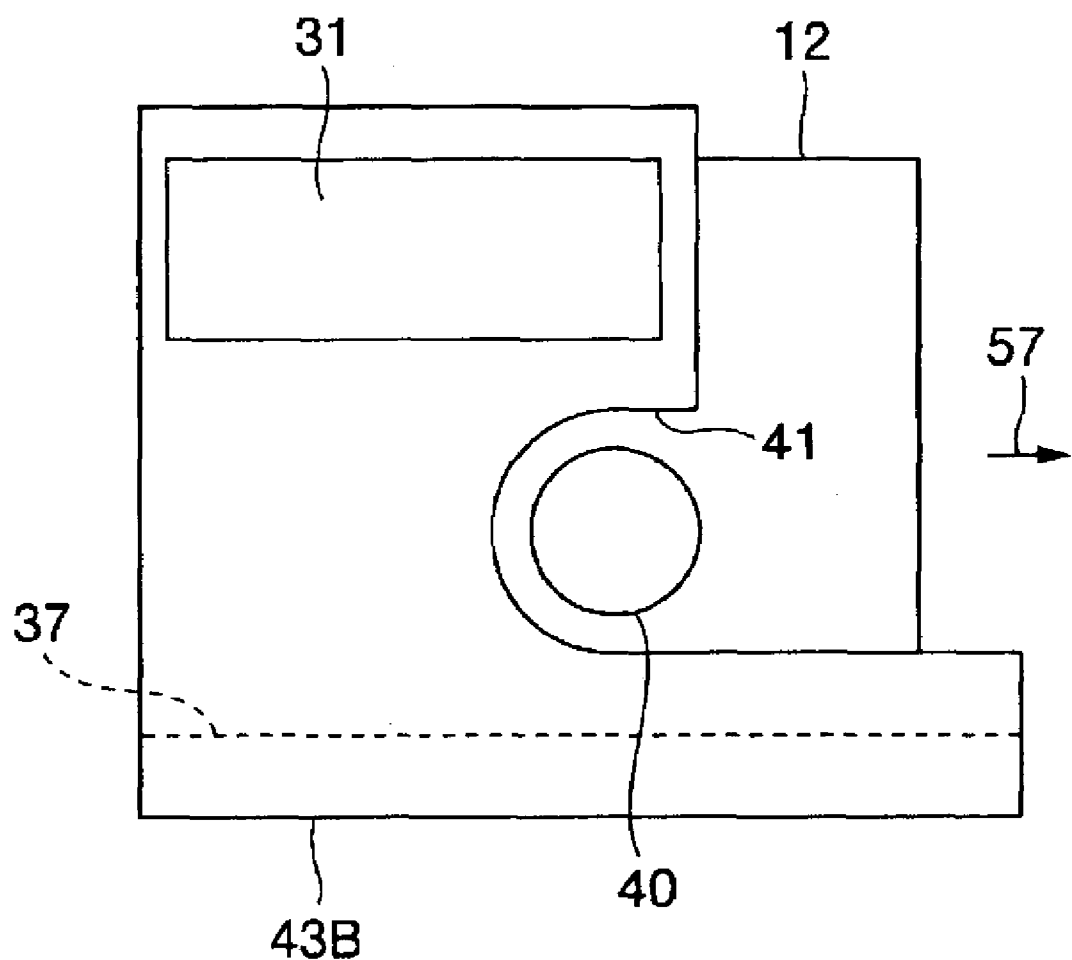

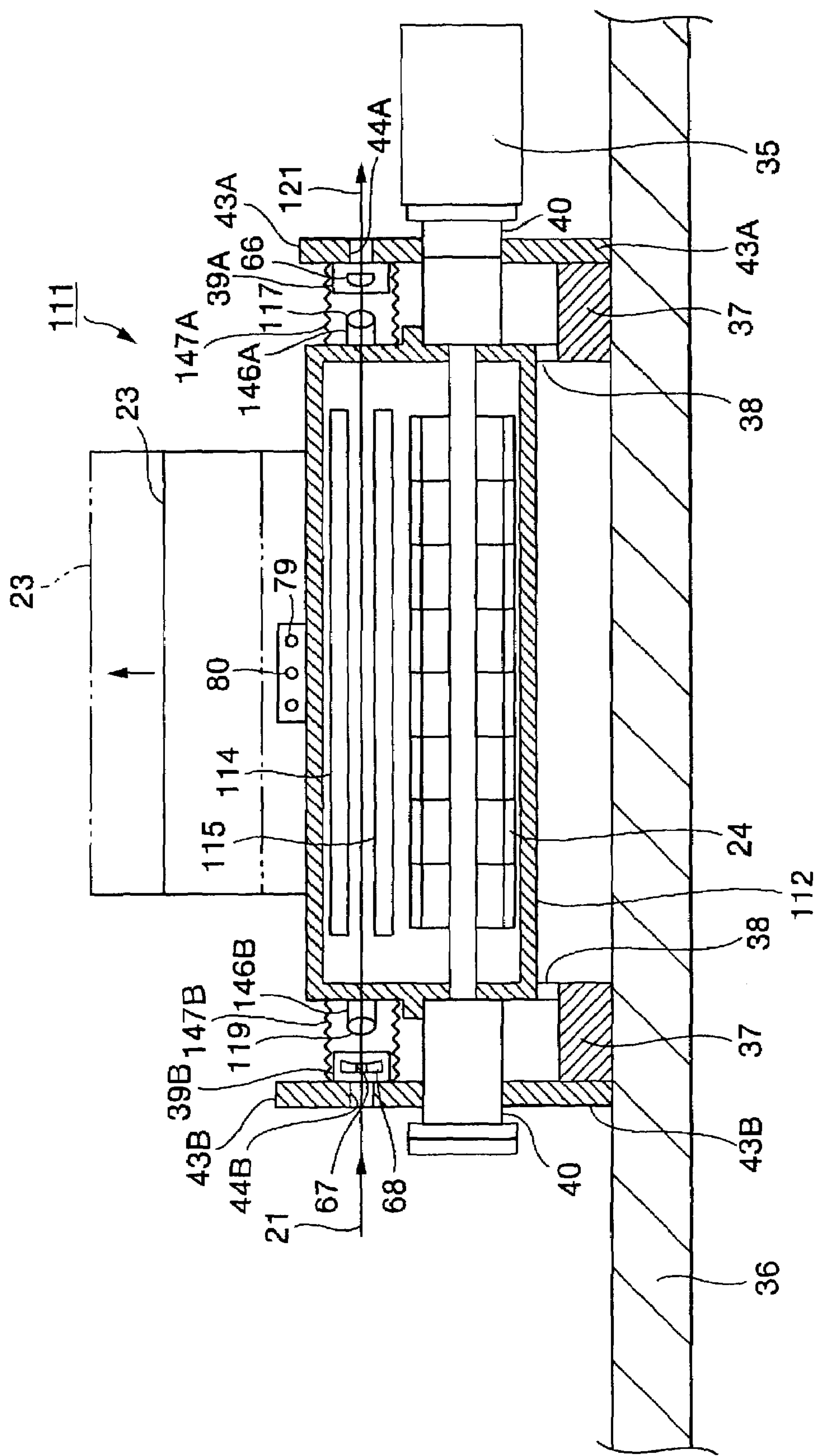
F I G. 4

F I G. 8
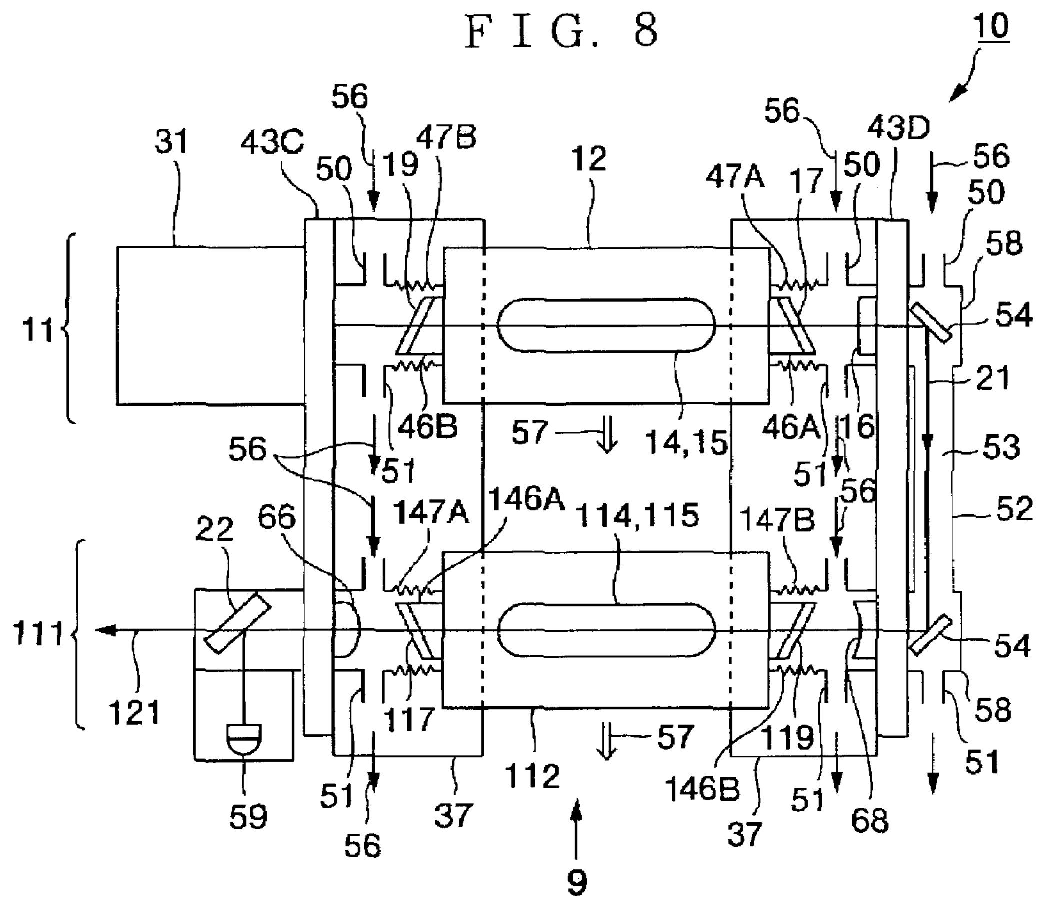
F I G. 9
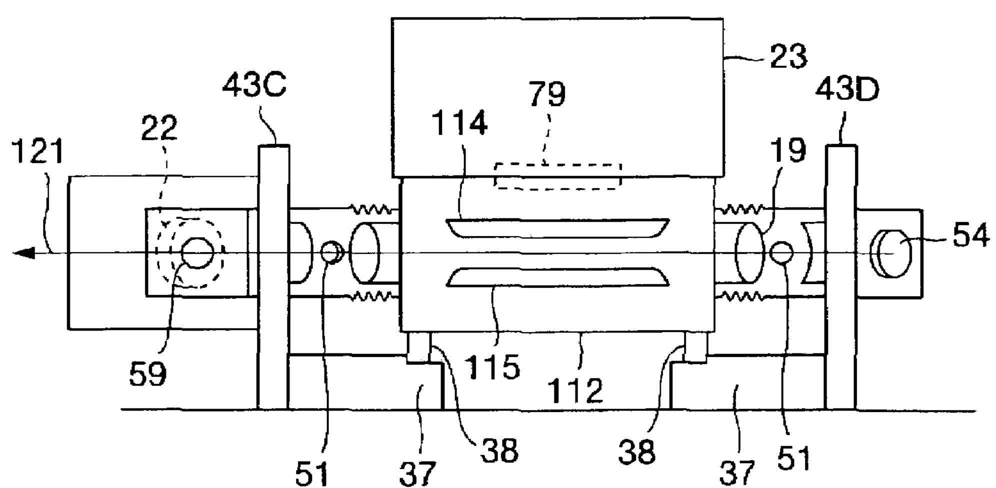

F I G. 1 1
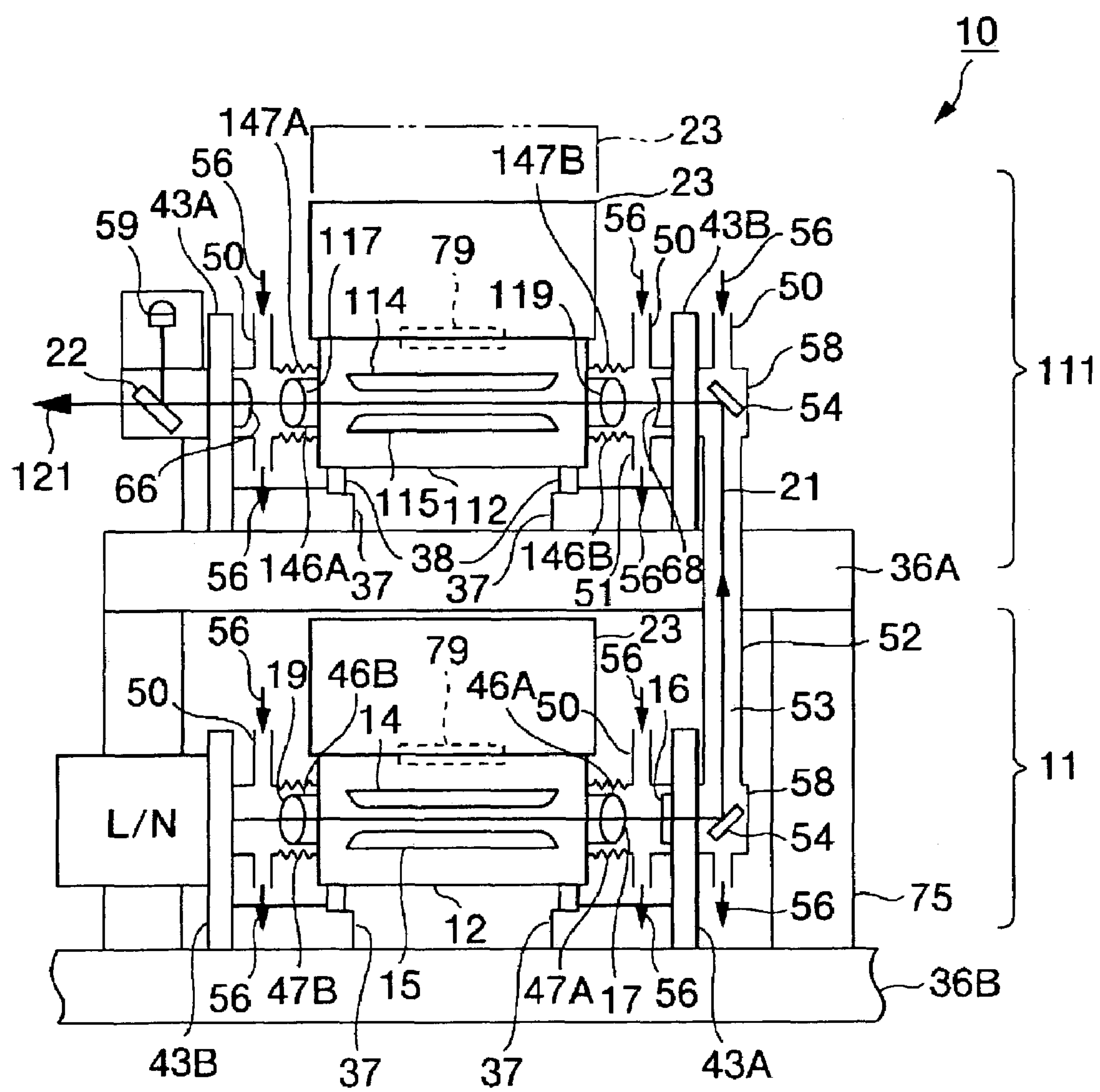

F I G. 1 2
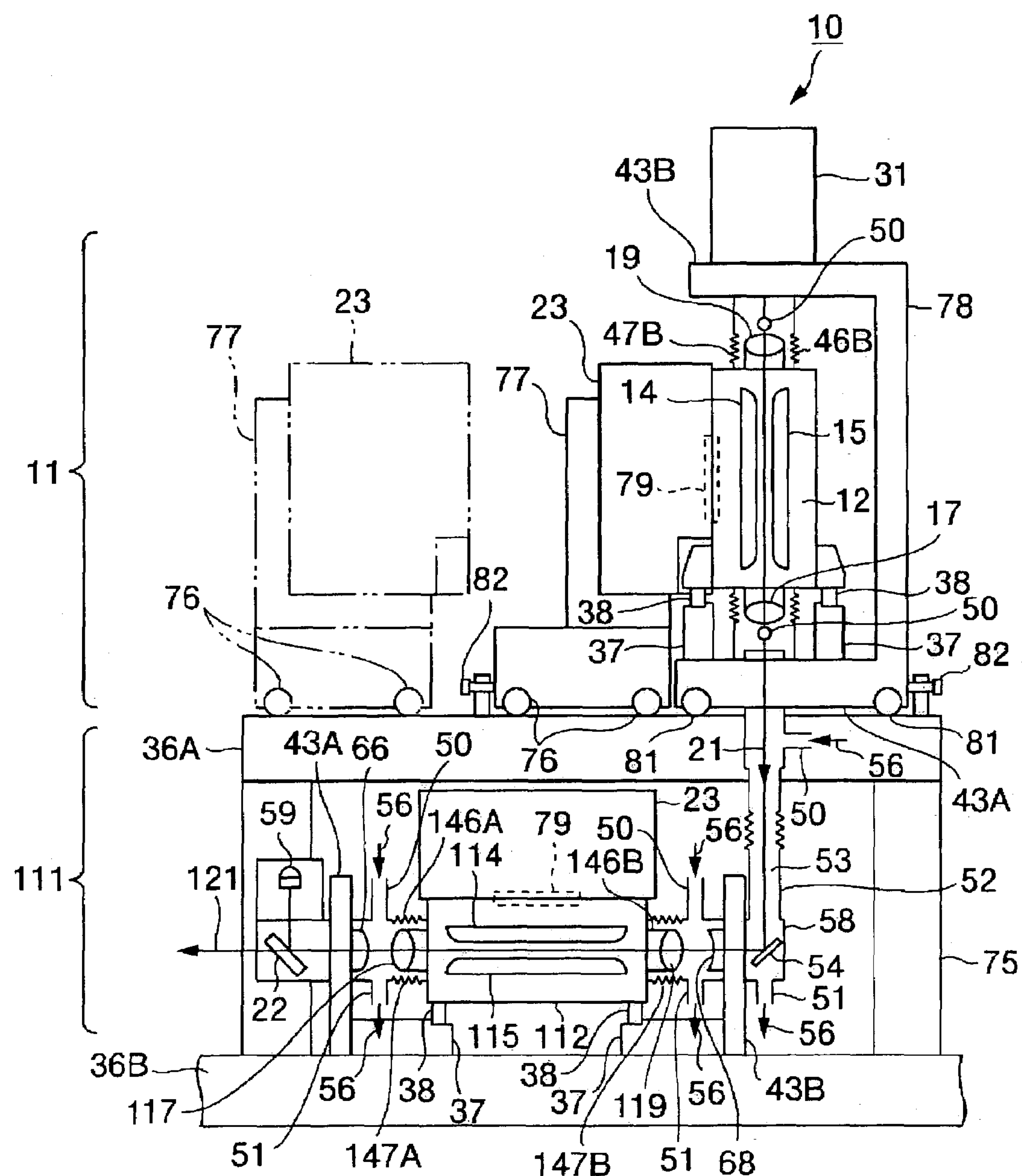

F I G. 1 3
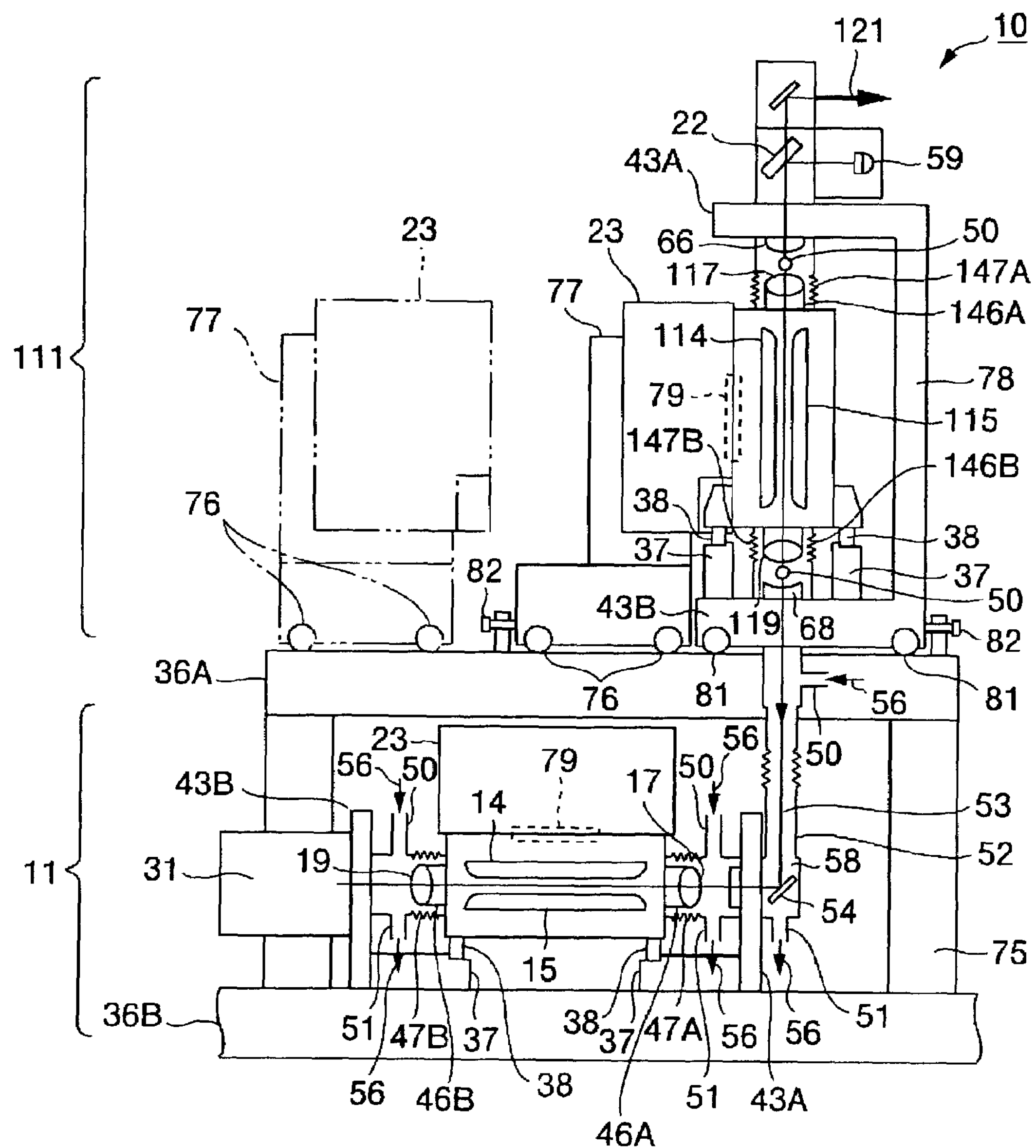

F I G. 1 4
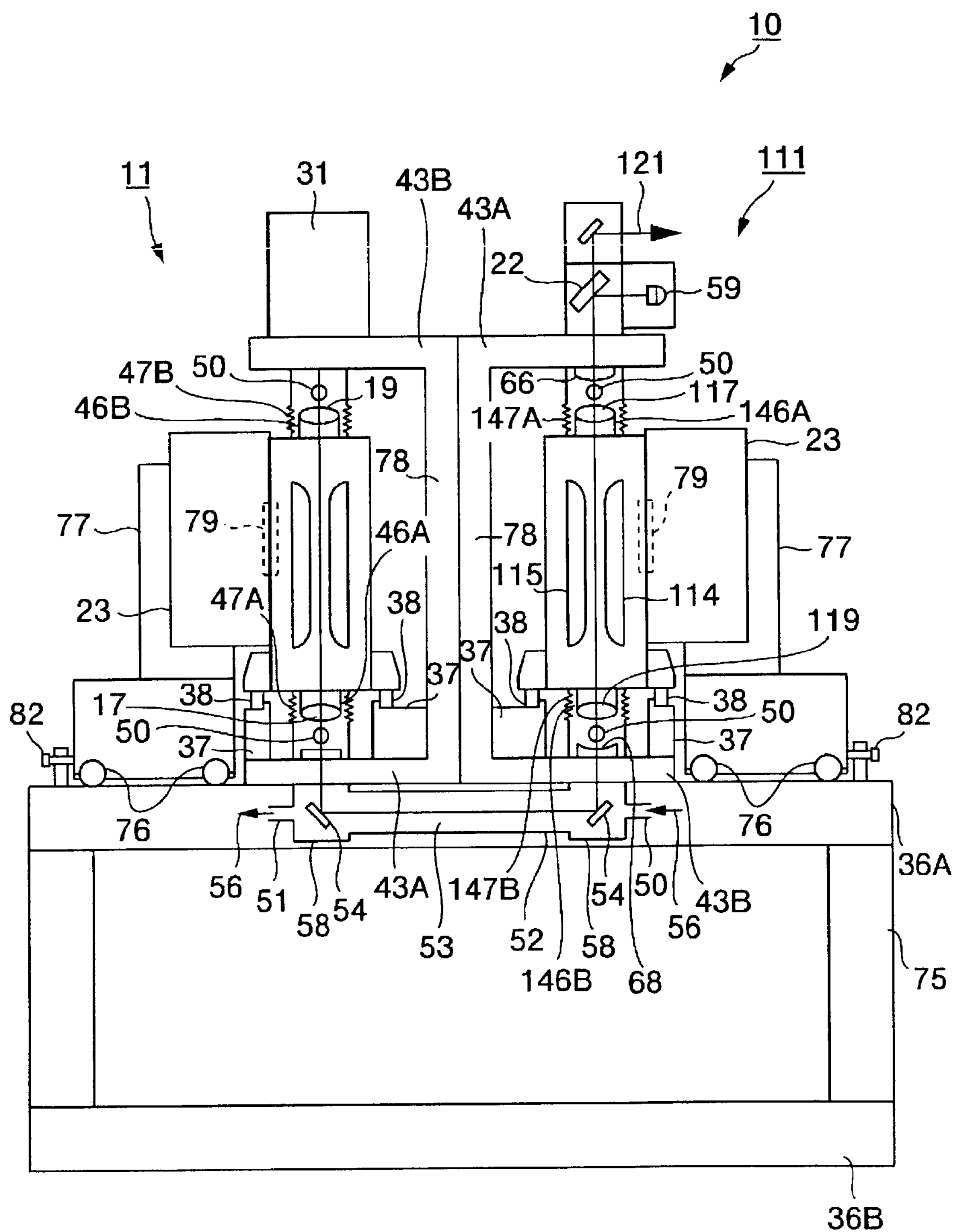

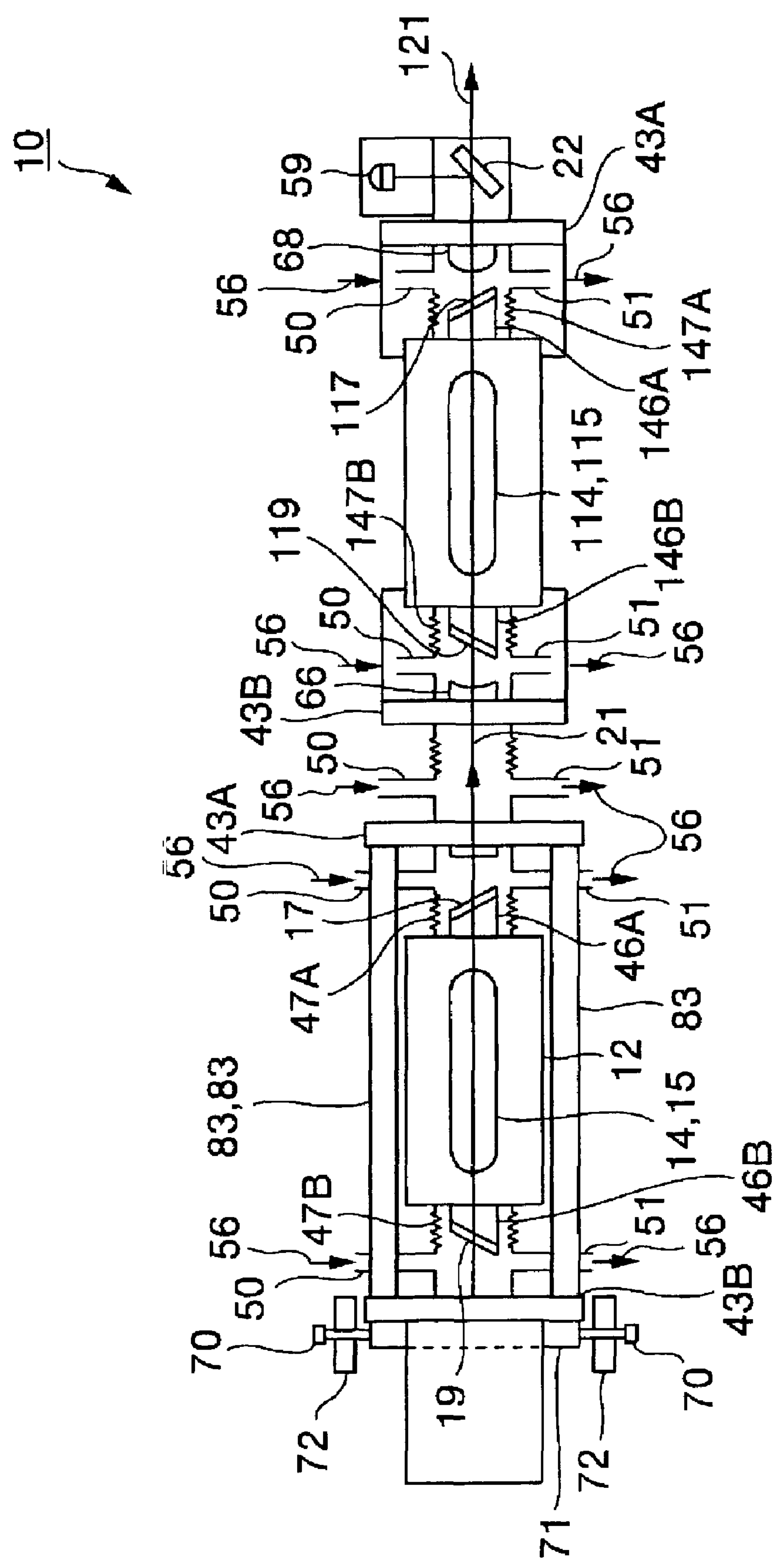
F I G. 1 5

INJECTION LOCKING TYPE OR MOPA TYPE OF GAS LASER DEVICE

TECHNICAL FIELD

The present invention relates to an injection locking type or MOPA type of gas laser device.

BACKGROUND ART

An injection locking type or MOPA (Main Oscillator Power Amplifier) type of laser device in which seed laser light oscillated from a seed laser unit is amplified by an amplifier is conventionally known. FIG. 17 represents an MOPA type of fluorine molecular laser device 90 (hereinafter referred to as the laser device 90) shown in "Feasibility of Highly Line-Narrowed F2 laser for 157 nm Microlithography (2000 SPIE Cymer, Inc)", and a prior art will be explained below based on FIG. 17.

In FIG. 17, the laser device 90 includes a seed laser unit 11 for oscillating seed laser light 21 and an amplifier 111 for amplifying the seed laser light 21. The seed laser unit 11 and the amplifier 111 include a laser chamber 12 and an amplifying chamber 112 for sealing in a laser gas respectively. The spectral line width of the seed laser light 21 generated by discharge between main electrodes 14 and 15 inside the laser chamber 12 is band-narrowed, for example, by a grating (not shown) in a band-narrowing box 31.

The band-narrowed seed laser light 21 passes through windows 17 and 19, then partially passes through a front mirror 16, and is emitted from the seed laser unit 11. Then it is reflected almost perpendicularly by an optical path mirror 54 and incident on the amplifier 111. Inside the amplifier 111, its pulse energy is amplified by discharge between amplifying electrodes 114 and 115 with its spectral line width and wavelength being kept. Thus, amplified laser light 121 with narrow spectral line width and high pulse energy is emitted. The amplified laser light 121 is incident on an aligner such as a stepper and used as light for exposure.

The aforementioned prior art, however, has the following disadvantages. Specifically, in the laser device 90, the seed laser light 21 is reflected almost perpendicularly in a horizontal plane and then incident on the amplifier 111. Hence, the installation area of both the seed laser unit 11 and the amplifier 111 (within a range shown by the broken line in FIG. 17) is increased. The laser device 90 for exposure is generally installed in a clean room whose unit cost per area is high, and therefore the smallest possible installation area is desired.

Moreover, if laser oscillation is continuously performed, dust produced in the laser chamber 12 and the amplifying chamber 112 adheres to the surfaces of the windows 17 and 19 placed in front of and behind the chambers 12 and 112, whereby it is necessary to clean the windows 17 and 19 regularly. Further, when the main electrodes 14 and 15 and the amplifying electrodes 114 and 115 provided inside the chambers 12 and 112 are worn out, it is necessary to replace them. For maintenance including such cleaning and replacement work, it is required to previously provide a work space on both sides of each of the chambers 12 and 112 in order for a worker to perform the maintenance. As a result, a larger installation area becomes necessary. Furthermore, the worker sometimes need to move from one side to the other side of each of the chambers 12 and 112, which causes a disadvantage that maintenance takes a lot of time.

SUMMARY OF THE INVENTION

The present invention is made in view of the aforementioned disadvantages, and its object is to provide an injection locking type or MOPA type of gas laser device which requires only a small installation area and allows easy maintenance.

In order to attain the aforementioned object, a first constitution of the injection locking type or MOPA type of gas laser device according to the present invention includes: a seed laser unit for exciting a laser gas inside a laser chamber and oscillating seed laser light; and an amplifier for exciting a laser gas inside an amplifying chamber and amplifying pulse energy of the seed laser light; and allows a worker to perform maintenance for the laser chamber and the amplifying chamber from the same side. Accordingly, it becomes unnecessary to provide a space for maintenance on both sides of each of the chambers, thereby reducing the installation area of the laser device.

A second constitution of the injection locking type or MOPA type of gas laser device according to the present invention includes: a seed laser unit for exciting a laser gas inside a laser chamber and oscillating seed laser light; and an amplifier for exciting a laser gas inside an amplifying chamber and amplifying pulse energy of the seed laser light; and allows the laser chamber and the amplifying chamber to be evacuated to the same side with respect to an optical axis of the seed laser light. Accordingly, it becomes possible to draw out the chambers to the same side and perform maintenance, whereby it becomes unnecessary to provide a space for maintenance on both sides of each of the chambers, thereby reducing the installation area of the laser device.

The gas laser device may further include: rails for mounting the laser chamber and the amplifying chamber thereon respectively; in which the laser chamber and the amplifying chamber may be evacuated along the rails. Hence, when being evacuated, the chambers can be evacuated along the rails, whereby there is a low possibility of the chambers shaking and thereby hitting the optical components and the like.

In the gas laser device, the laser chamber and the amplifying chamber may be respectively mounted on the rails via rotatable rollers. Therefore, the evacuation of chambers can be performed with small force. Further, in the gas laser device, the rails may be placed almost perpendicularly to the optical axis of the seed laser light. Hence, it becomes possible to minimize the evacuation distance of each of the chambers and locate the chambers farther away from the seed laser light. Furthermore, in the gas laser device, the laser chamber and the amplifying chamber may be mounted on the same rails. Consequently, a space required to provide the rails is reduced.

Besides, in the gas laser device, the laser chamber and the amplifying chamber may be arranged vertically to each other, whereby the installation area of the laser device can be reduced. In addition, in the gas laser device, at least one of the laser chamber and the amplifying chamber may be placed so that the emitted laser light is oriented in a vertical direction. As a result, when a power source is removed from the chamber, it is unnecessary to lift the heavy power source, and the power source can be moved in a horizontal direction from the path of the chamber, whereby its movement is facilitated.

Moreover, the laser device may further include: an optical path cover for covering an optical path space which the seed laser light passes through; and a purge mechanism for filling the interior of the optical path space with a clean purge gas with low reactivity. Thereby, even if the seed laser light has vacuum ultraviolet wavelength, the seed laser light is never attenuated by the mixing of oxygen into the optical path space. In addition, impurities such as dust in the optical path space seldom adhere into the optical components. Further, the gas laser device may further include optical axis adjusting means for adjusting the optical axis of the seed laser light. Accordingly, the seed laser light can be suitably introduced into the amplifier, whereby pulse energy of the amplified laser light emitted from the amplifier can be increased.

Furthermore, in the gas laser device, the optical axis adjusting means may be an optical path mirror for reflecting the seed laser light. Consequently, the optical axis can be adjusted easily by adjusting the optical path mirror. Moreover, the gas laser device may further include: manipulating means for manipulating an angle of the optical path mirror from outside the optical path space; and sealing means for preventing outside air from being mixed into the optical path space when the manipulating means is manipulated. Accordingly, even if the optical path mirror is manipulated, neither oxygen nor dust is mixed into the optical path space, whereby attenuation of the seed laser light and adhesion of dust to the optical mirror and so on seldom occur. Further, in the gas laser device, the optical axis adjusting means may be moving means for moving cavity plates for fixing a resonator of the laser chamber. Hence, the laser chamber and the amplifying chamber can be arranged in a straight line, whereby the installation area of the laser device can be reduced.

BRIEF DESCRIPTION OF THE DRAWINGS

FIG. 1 is a plan view of an injection locking type of fluorine molecular laser device according to a first embodiment of the present invention;

FIG. 2 is a front view of a seed laser unit according to the first embodiment;

FIG. 3 is a block diagram of a rear cavity plate according to the first embodiment;

FIG. 4 is a front view of an amplifier according to the first embodiment;

FIG. 8 is a plan, block diagram of a laser device according to a third embodiment of the present invention;

FIG. 9 is a front view of the laser device according to the third embodiment;

FIG. 11 is a front view of the laser device according to the fourth embodiment;

FIG. 12 is a front view of a laser device according to a fifth embodiment of the present invention;

FIG. 13 is a front view of the laser device according to the fifth embodiment;

FIG. 14 is a front view of the laser device according to the fifth embodiment;

FIG. 15 is a plan view of a laser device according to a sixth embodiment of the present invention;

BEST MODE FOR CARRYING OUT THE INVENTION

Figure 5:
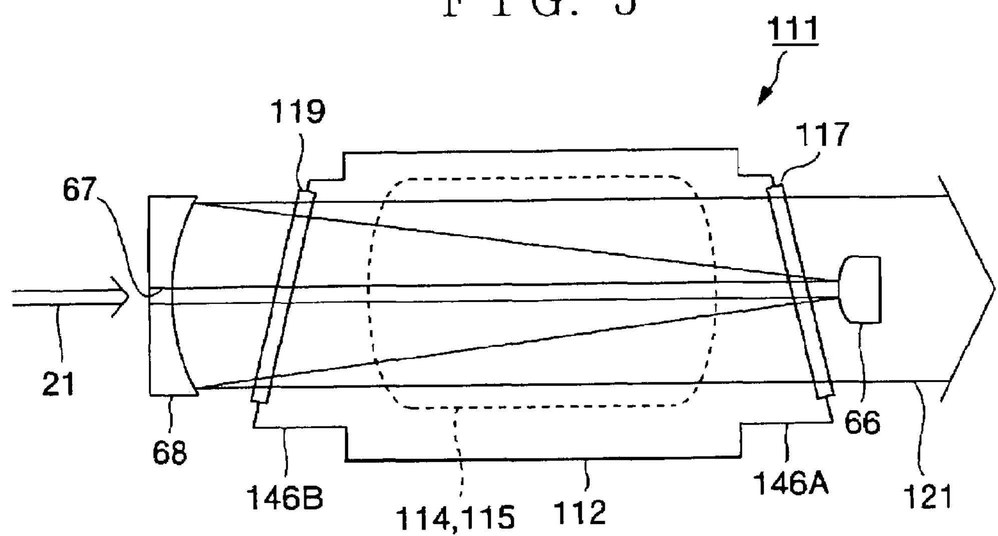
FIG. 5 is an explanatory view of the amplifier according to the first embodiment in plan view.

Preferred embodiments according to the present invention will be explained in detail below with reference to the drawings.

First, a first embodiment will be explained. FIG. 1 shows a block diagram of an injection locking type of fluorine molecular laser device 10 (hereinafter referred to as the laser device 10) in plan view. In FIG. 1, the laser device 10 includes a seed laser unit 11 for oscillating band-narrowed seed laser light 21 and an amplifier 111 for amplifying the seed laser light 21 while keeping its wavelength and spectrum line width. The seed laser unit 11 and the amplifier 111 are mounted on a base plate 36, for example, made of cast iron.

FIG. 2 shows a front view of the seed laser unit 11. As shown in FIG. 2, the seed laser unit 11 includes a laser chamber 12 which seals in a laser gas containing fluorine. Two left and light rails 37 and 37 are fixed on the top of the base plate 36 almost perpendicularly to their longitudinal direction (left-right direction in FIG. 1). For example, four rollers (wheels) 38 and 38 are rotatably fixed to the bottom of the laser chamber 12. The rollers 38 and 38 are mounted on the rails 37 and 37, and allow the laser chamber 12 to move along the longitudinal direction of the rails 37 and 37 with relatively small force.

When laser oscillation is performed, the laser chamber 12 is pushed along the rails 37 and 37 in a far direction in FIG. 2 (upward direction in FIG. 1), and the rails 37 and 37 and the laser chamber 12 are fixed together with bolts (not shown) or the like while being pressed against a positioning stopper (not shown). Hence, the laser chamber 12 can be always secured in a substantially fixed position.

As shown in FIG. 2, a front cavity plate 43A and a rear cavity plate 43B stand upright respectively in front of (on the right side of FIG. 2) and behind the laser chamber 12. Lower end portions of the cavity plates 43A and 43B are anchored respectively to sides of the rails 37 and 37 with bolts (not shown). Incidentally, the rails 37 and 37 in FIG. 1 are drawn with their width being increased in a lateral direction in FIG. 1 for explanation. Moreover, instead of anchoring the cavity plates 43A and 43B to the rails 37 and 37, it is possible to fix a fixing member such as a block (not shown) to the base plate 36 and fix the cavity plates 43A and 43B to this block.

A front window holder 46A to which a front window 17 for passing the seed laser light 21 therethrough is attached and a rear window holder 46B to which a rear window 19 is attached are fixed respectively to a front and a rear portion of the laser chamber 12. Spaces between the laser chamber 12, and the front cavity plate 43A and the rear cavity plate 43B are sealed respectively by a front bellows 47A and a rear bellows 47B. A light passing hole 44A which the seed laser light 21 passes through is provided in the front cavity plate 43A. At a rear portion of the front cavity plate 43A, a mirror holder 39 housing a front mirror 16 for partially passing the seed laser light 21 therethrough is provided. A light passing hole 44B which the seed laser light 21 passes through is provided in the rear cavity plate 43B. A band-narrowing box 31 described later is fixed to a rear portion of the rear cavity plate 43B.

A pair of main electrodes 14 and 15 are arranged facing each other inside the laser chamber 12. By supplying a laser gas to a space between the main electrodes 14 and 15 by a once-through fan 24 which is driven by a motor 35 and applying high voltage to the space between the main electrodes 14 and 15 from a high voltage power source 23, the laser gas is exited, and the seed laser light 21 is generated. Both end portions of the once-through fan 24 are supported by magnetic bearings 40 and 40. FIG. 3 shows the rear cavity plate 43B seen in the direction of the arrow 3 in FIG. 2. As shown in FIG. 3, in order to attach the magnetic bearing 40 to the laser chamber 12, the rear cavity plate 43B is provided with a cut-out 41 in a portion thereof. The same applies to the front cavity plate 43A.

The high voltage power source 23 is mounted on the top of the laser chamber 12. The high voltage power source 23 and a discharge circuit (not shown) attached to the top of the laser chamber 12 are connected via a connector 79 with bolts 80. The seed laser light 21 generated in the laser chamber 12 is incident on the band-narrowing box 31. As shown in FIG. 1, a band-narrowing optical component group, for example, including two prisms 32 and 32 and a grating 33 is provided inside the band-narrowing box 31. The beam width of the laser light 21 is increased by the prisms 32 and 32, and only light with a narrow spectral line width with a predetermined wavelength as a center is diffracted in the optical axis direction of a laser resonator by the grating 33. Thus, the band narrowing of the wavelength of the seed laser light 21 is carried out.

As shown in FIG. 1, the seed laser light 21 emitted from the seed laser unit 11 is reflected by two optical path mirrors 54 and 54 which are optical axis adjusting means, and it is incident on the amplifier 111. An optical path space 53, which the seed laser light 21 passes through, between the seed laser unit 11 and the amplifier 111 is hermetically closed by an optical path cover 52. Incidentally, although the optical path mirror 54 is explained here as a total reflection mirror, it is also possible that, with this optical path mirror as a partial reflection mirror, pulse energy and a wavelength characteristic of the seed laser light 21 which has passed through the optical path mirror 54 is detected by a detector (not shown).

The optical path cover 52 is provided with a purge gas inlet 50 to which a purge pipe 49 is connected from a purge gas cylinder 48 which seals in a clean and low activity purge gas. The purge gas is continuously supplied into the optical path cover 52 from the purge gas cylinder 48. Nitrogen is generally used as the purge gas, but an inert gas such as helium may be used. The purge gas inlet 50 is also provided in each of bellows 47A and 47B, and bellows 147A and 147B provided in the amplifier 111 described later. The purge gas is also continuously supplied from the purge pipe 49 into these bellows 47A, 47B, 147A, and 147B, and into the band-narrowing box 31. The purge gas is released into the atmosphere from a purge gas outlet 51 as shown by the arrow 56.

As described above, the optical path space 53, which the seed laser light 21 passes through, is always filled with the purge gas by a purge mechanism including the purge gas cylinder 48, the purge pipe 49, and the purge gas inlet and outlet 50 and 51. Consequently, dust does not enter the optical path space 53, and hence the possibility of dust adhering to the optical path mirror 54 to thereby lower reflectivity is low. Moreover, oxygen is expelled from the optical path space 53, whereby the seed laser light 21 with a vacuum ultraviolet wavelength is seldom attenuated by being absorbed by oxygen.

Next, the amplifier 111 will be explained. FIG. 4 shows a front sectional view of the amplifier 111. As shown in FIG. 4, the amplifier 111 includes an amplifying chamber 112 which seals in a laser gas, and a pair of amplifying electrodes 114 and 115 are provided facing each other inside the amplifying chamber 112. Similarly to the laser chamber 12, the amplifying chamber 112 is mounted on two left and right rails 37 and 37 fixed onto the base plate 36, for example, via four rollers 38 and 38. When laser oscillation is performed, the amplifying chamber 112 is pushed along the rails 37 and 37 in a far direction in FIG. 4, and the rails 37 and 37 and the amplifying chamber 112 are fixed together with bolts (not shown) or the like while being pressed against a positioning stopper (not shown).

Similarly to the laser chamber 12, the front cavity plate 43A and the rear cavity plate 43B which are fixed to sides of the rails 37 and 37 stand upright respectively in front of (on the right side of FIG. 4) and behind the amplifying chamber 112. The light passing hole 44A which an amplified laser light 121 passes through is provided in the front cavity plate 43A, and a mirror holder 39A to which a convex mirror is fixed is attached. The light passing hole 44B which the seed laser light 21 passes through is provided in the rear cavity plate 43B, and a mirror holder 39B, to which a concave mirror 68 with a hole having a light introducing hole 67 almost in its center is fixed, is attached.

A front window holder 146A to which the front window 17 for passing the amplified laser light 121 therethrough is attached and a rear window holder 146B to which the rear window 19 is attached are fixed respectively to a front and a rear portion of the amplifying chamber 112. Spaces between the amplifying chamber 112, and the front cavity plate 43A and the rear cavity plate 43B are sealed respectively by the front bellows 147A and the rear bellows 147B.

FIG. 5 shows an explanatory view of the amplifier 111 in plan view. It should be noted that the mirror holders 39A and 39B and the like are omitted for clarification. As shown in FIG. 5, the seed laser light 21 passes through an amplifying window from the light introducing hole 67 of the concave mirror 68 with the hole and is incident on the amplifying chamber 112, and goes back and forth several times between the convex mirror 66 and the concave mirror 68 with the hole. On this occasion, inside the amplifying chamber 112, high voltage is applied to a space between the amplifying electrodes 114 and 115, which face each other perpendicularly to the paper surface in FIG. 5, from the high voltage supply source 23 (not shown in FIG. 5) in synchronization with the oscillation of the seed laser light 21, and amplification discharge occurs. By this amplification discharge, the pulse output of the seed laser light 21 is amplified with the wavelength and spectral width thereof being kept while the seed laser light 21 goes back and forth in the amplifier 111. Then, the seed laser light 21 is taken out as the amplified laser light 121 with a doughnut-shaped section from around the convex mirror 66.

As shown in FIG. 1, a beam splitter 22 is provided on an optical axis of the amplified laser light 121, and the amplified laser light 121 which has passed through the beam splitter 22 is incident on an aligner such as a stepper (not shown) to become a light source for processing. On the other hand, the amplified laser light 121 reflected by the beam splitter 22 is incident on a monitor unit 59 and its pulse energy, spectral characteristics, and so on are measured. The optical path mirror 54 is housed in a mirror box 58 which communicates with the optical path space 53. The mirror box 58 includes an angle adjusting mechanism for manipulating the angle from the outside to adjust the optical axis of the seed laser light 21 to thereby lead the seed laser light 21 into the amplifying chamber 112.

Figure 6:
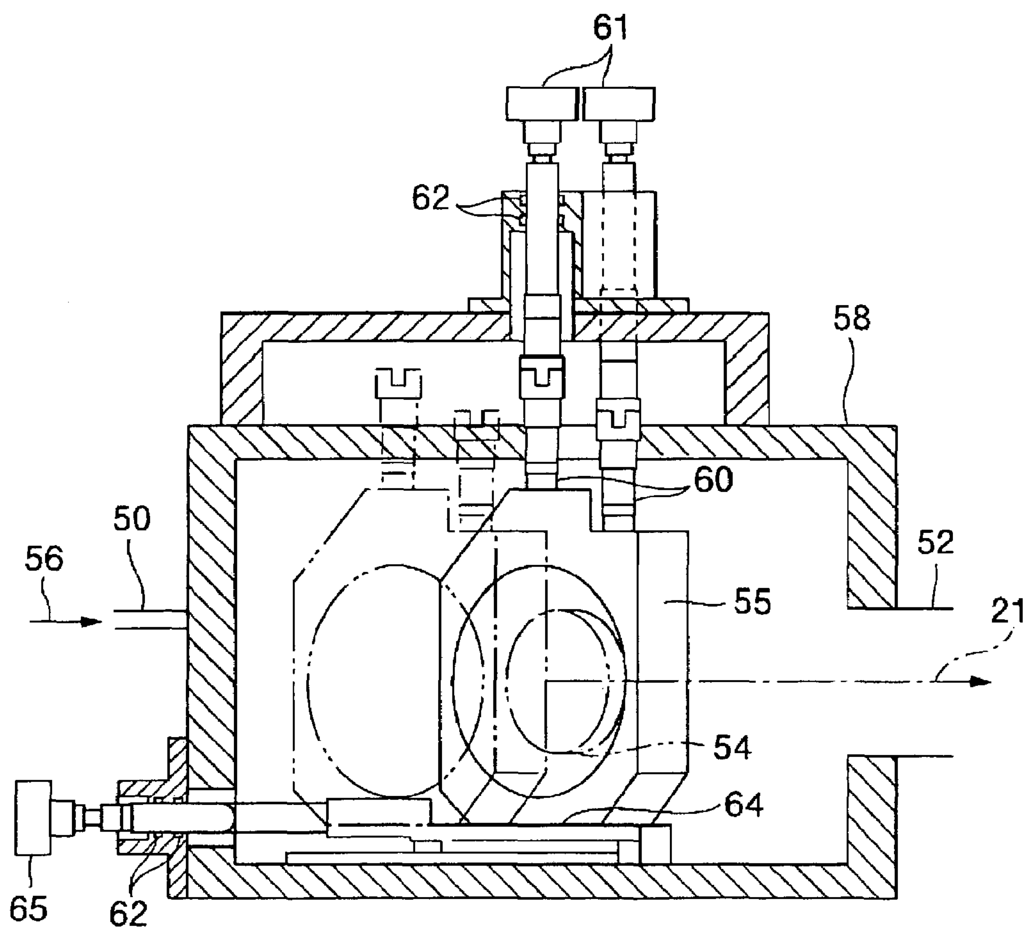
FIG. 6 is a structural diagram of a mirror box according to the first embodiment.

FIG. 6 shows a sectional view of the mirror box 58. In FIG. 6, the seed laser light 21 is incident from the far side to the near side perpendicularly to the paper surface, reflected almost perpendicularly by the optical path mirror 54, and emitted to the right side of the paper surface. The mirror box 58 includes an optical path mirror holder 55 for holding the optical path mirror 54. For example, two micrometers 60 and 60 are attached to the optical path mirror holder 55. It is possible to change the angle of the optical path mirror 54 by rotating the micrometers 60 and 60 and thereby adjust the optical axis of the seed laser light 21 to be emitted to the right side of FIG. 6.

The mirror box 58 is provided with rotatable rotary rods 61 and 61. A tip portion of the rotary rod 61 has the same flat shape as a tip portion of a flatblade screw driver, and a minus-shaped slot, for example, is provided in the head of the micrometer 60. It is possible to fit the tip portion of the rotary rod 61 into the minus-shaped slot of the head of the micrometer 60 to thereby rotate the micrometer 60 from outside the mirror box 58. For example, two O-ring grooves 62 and 62 are provided at an outer peripheral portion of the rotary rod 61, and by O-rings fitted in the O-ring grooves 62 and 62, the interior of the mirror box 58 is securely sealed even if the rotary rod 61 is rotated.

The optical path mirror holder 55 is mounted on a slider 64 which is slidable almost perpendicularly to the incident seed laser light 21. The slider 64 is operable from outside the mirror box 58 by pushing and pulling a cylindrical slider rod 65, whereby the optical path mirror 54 is projectable from and retractable into the optical axis of the seed laser light 21. The O-ring grooves 62 and 62 are provided at an outer peripheral portion of the slider rod 65, and by O-rings (not shown) fitted in the O-ring grooves 62 and 62, sealing is not broken even if the slider rod 65 is pushed and pulled. Incidentally, in FIG. 6, other O-ring grooves provided to seal the mirror box 58 are not shown.

The mirror box 58 is provided with an openable and closeable lid (not shown) on the near side of the optical path mirror 54 in FIG. 6. By displacing the optical path mirror 54 from the optical axis of the seed laser light 21, taking the lid off, and fixing a measuring instrument on the outside of the mirror box 58 (on the near side of FIG. 6) so as not to break sealing, various characteristics such as spectral characteristics and beam divergence of the seed laser light 21 can be measured.

In FIG. 1, the bellows 47A and 47B, and 147A and 147B, and chambers 12 and 112 are respectively fixed together with bolts (not shown). The bellows 47A and 47B and the cavity plates 43A and 43B, and the bellows 147A and 147B and the cavity plates 43A and 43B are respectively fixed together by removable clamps (not shown) with hand-tightening bolts. The bolts fixing the rails 37 and 37 and the chambers 12 and 112 are removed, and the chambers 12 and 112 are drawn out along the rails 37 and 37, for example, in the downward direction in FIG. 1 (as shown by the arrow 57). On this occasion, as described above, the cavity plates 43A and 43B are respectively provided with the cut-outs 41 and 41, whereby the magnetic bearings 40 and 40 can be drawn out without touching the cavity plates 43A and 43B. Such displacement of the chambers 12 and 112 from the optical axis along the rails 37 and 37 is called evacuation.

The chambers 12 and 112 are evacuated after the bellows 47A, 47B, 147A, and 147B and the cavity plates 43A and 43B are separated by removing the hand-tightening bolts of the clamps. Thus, the bellows 47A, 47B, 147A, and 147B are drawn out while being attached to the chambers 12 and 112. Further, after the bolts 89 are removed and the high voltage power sources 23 and 23 are lifted by a lift (not shown) as shown by two-dot chain lines in FIG. 2 and FIG. 4, the evacuation is performed.

As explained above, according to the first embodiment, the laser chamber 12 and the amplifying chamber 112 are respectively mounted on the rails 37 and 37 which are parallel to each other, and both of the chambers 12 and 112 can be drawn out to the same side in a horizontal plane. Hence, when maintenance including cleaning of the windows 17 and 19, replacement of the electrodes 14, 15, 114, and 115, and so on is performed, a worker can perform work from only one side of the laser device 10, whereby the moving distance of the worker is short. Furthermore, it is unnecessary to provide a space which the worker enters through on the other side of the laser device 10, and hence the laser device 10 can be installed very close to a wall surface or the like, whereby the installation area of the laser device 10 can be reduced.

Figure 7:
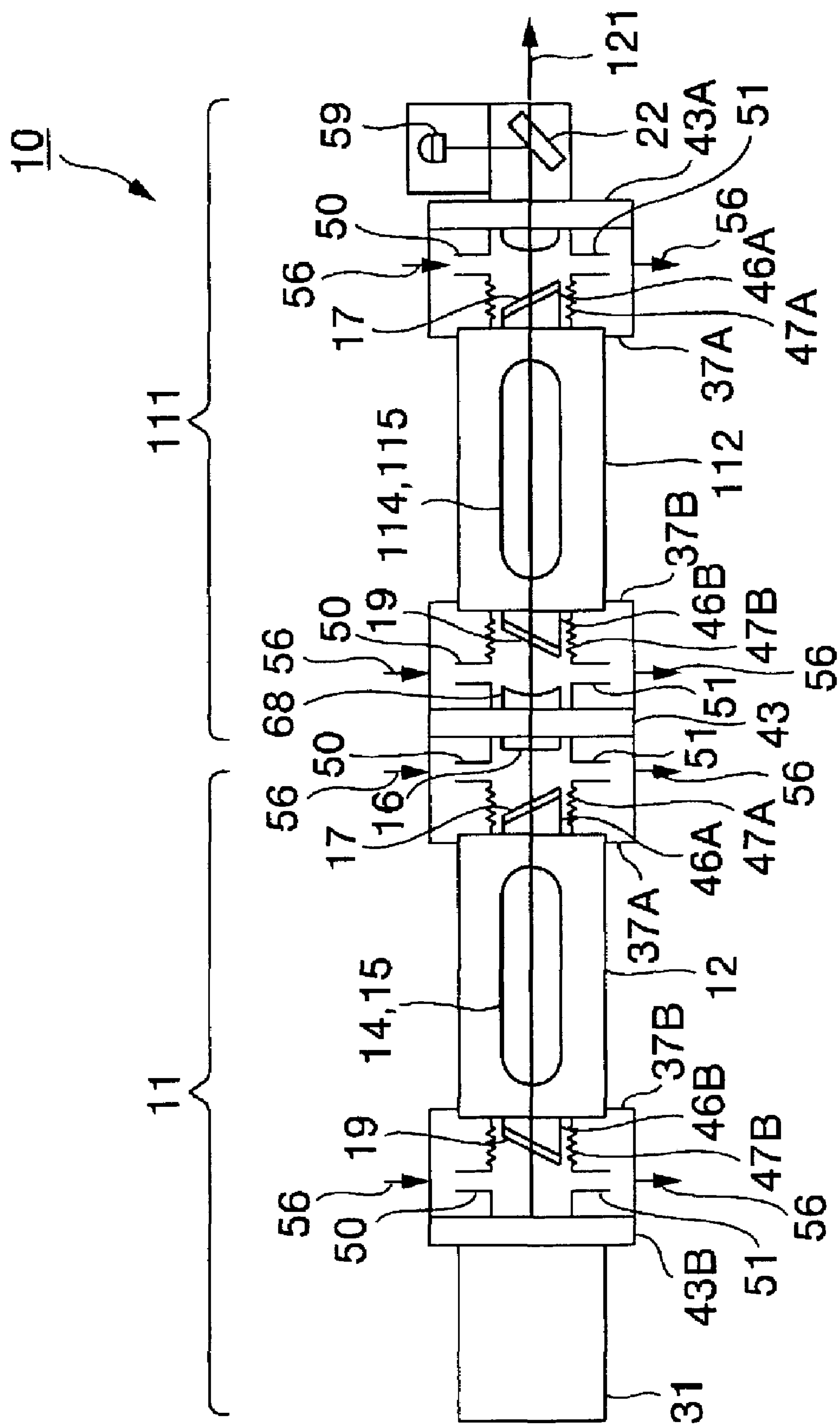
FIG. 7 is a plan view of a laser device according to a second embodiment of the present invention.

Next, a second embodiment will be explained. FIG. 7 shows a block diagram of the laser device 10 according to the second embodiment in plan view. As shown in FIG. 7, according to the second embodiment, the seed laser unit 11 and the amplifier 111 are arranged in series. Rails 37A and 37B are fixed on the base plate (not shown) in FIG. 7. Although the purge gas cylinder 48 and the purge pipe 49 are omitted, the purge gas is continuously supplied from the purge gas inlet 50 and released into the atmosphere from the purge gas outlet 51 (as shown by the arrows 56). A numeral 43 denotes a cavity plate which serves both as the front cavity plate of the seed laser unit 11 and as the rear cavity plate of the amplifier. Hence, it becomes possible to adjust the optical axis of the seed laser light 21 to the amplifier 111 with a high degree of precision. Consequently, as compared with the first embodiment, the installation area can be further reduced.

A third embodiment will be explained. FIG. 8 shows a block diagram of the laser device 10 according to the third embodiment in plan view, and FIG. 9 shows a front view seen in the direction of the arrow 9 in FIG. 8. As shown in FIG. 8, the laser chamber 12 and the amplifying chamber 112 are mounted on the same rails 37 and 37. A cavity plate 43D is designed to serve both as the front cavity plate for the seed laser unit 11 and as the rear cavity plate for the amplifier 111, and is fixed to a side of the rail 37. A cavity plate 43C is designed to serve as the rear cavity plate for the seed laser unit 11 and as the front cavity plate for the amplifier 111, and is fixed to a side of the rail 37. When the laser chamber 12 is drawn out in the direction of the arrow 57, first the amplifying chamber 112 is drawn out, and then the laser chamber 12 is drawn out. By mounting the laser chamber 12 and the amplifying chamber 112 on the same rails 37 and 37 as described above, it becomes possible to draw them out in the same direction.

Figure 10:
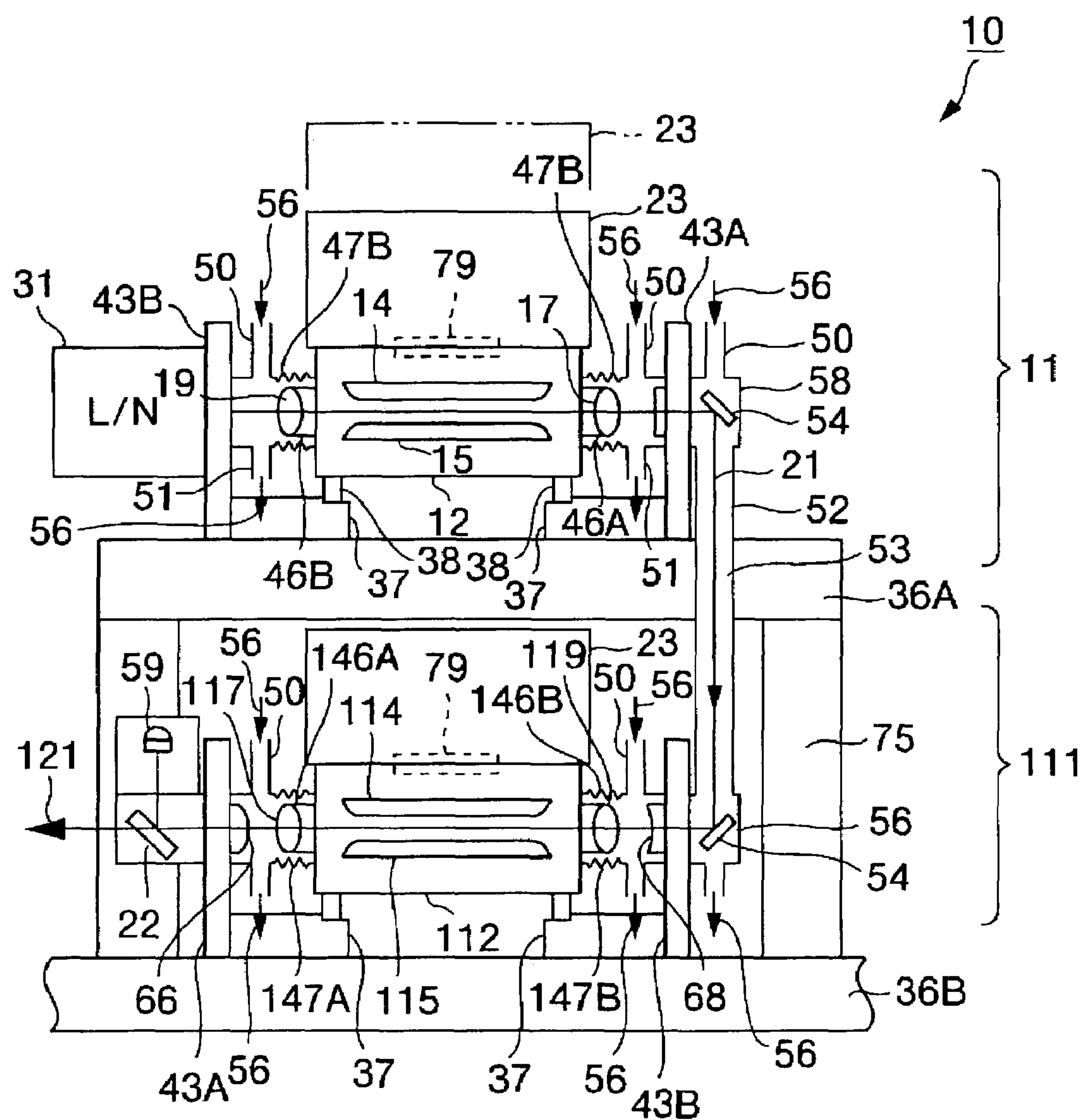
FIG. 10 is a front view of a laser device according to a fourth embodiment of the present invention.

A fourth embodiment will be explained. FIG. 10 shows a front view of the laser device 10 according to the fourth embodiment. As shown in FIG. 10, the laser device 10 includes a frame 75 which fixes the base plate 36 composed of two upper and lower stages. The seed laser unit 11 is mounted on an upper base plate 36A, and the amplifier 111 is mounted on a lower base plate 36B. The seed laser light 21 emitted from the seed laser unit 11 is led downward by the optical path mirror 54 and incident on the amplifier 111. Both the laser chamber 12 and the amplifying chamber 112 can be drawn out to the near side of FIG. 10. By arranging the laser chamber 12 and the amplifying chamber 112 vertically to each other, the installation area of the laser device 10 can be further reduced.

FIG. 11 shows an example in which the seed laser unit 11 is placed on the lower base plate 36B. The high voltage power source 23 is mounted on each of the chambers 12 and 112. As shown by the two-dot chain line in FIG. 10 and FIG. 11, if one which uses the high voltage power source 23 of larger size out of the seed laser unit 11 and the amplifier 111 is mounted on the upper base plate 36A, the height of the upper base plate 36A can be reduced, whereby stabilization is provided.

FIG. 12 shows a front view of the laser device 10 according to a fifth embodiment. In FIG. 12, the rails 37 and 37 are fixed onto the upper base plate 36A perpendicularly to the paper surface in FIG. 12, and the laser chamber 12 is mounted on the rails 37 and 37 via the rollers 38 so that the optical axis of the emitted seed laser light 21 substantially coincides with a vertical direction. The laser chamber 12 includes a cavity frame 78 obtained by integrating two cavity plate 43A and cavity plate 43B and a bridge connecting them to take the shape of U tilted by 90 degrees. Similarly to the aforementioned respective embodiments, optical components such as the band-narrowing box 31 are fixed to the cavity plates 43A and 43B.

The cavity frame 78 is movable by cavity rollers 81 and positioned by positioning bolts 82 and 82. The seed laser light 21 emitted downward from the seed laser unit 11 is reflected by the optical path mirror 54 and incident on the amplifier 111. The high voltage power source 23 for applying high voltage to the main electrodes 14 and 15 inside the laser chamber 12 is supported by a power source frame 77. The power source frame 77 includes power source rollers 76, and as shown in the two-dot chain line, it can move the high voltage power source 23 in a left direction in FIG. 12. At the time of evacuation, the aforementioned connector 79 is removed, and the high voltage power source 23 is horizontally moved in the left direction in FIG. 12 by means of the rollers 76.

As stated above, also in the fifth embodiment, the chambers 12 and 112 can be evacuated in the same direction along the rails 37 and 37. By placing the seed laser unit 11 in a vertical position, the weight of the band-narrowing box 31 can be supported by the cavity frame 78. Accordingly, the band-narrowing box 31 can be stably supported without being supported in a cantilever mode as in the first embodiment, whereby it is seldom influenced by vibration and the like. Further, the heavy high voltage power source 23 is supported by the power source frame 77, and hence the weight of the high voltage power source 23 is not applied to the laser chamber 12. Therefore, the structure of the laser chamber 12 can be simplified.

Moreover, as described above, according to the first to fourth embodiments, the laser chamber 12 is evacuated after the high voltage power source 23 is lifted by the lift, and hence the sturdy lift is required to lift the heavy high voltage power source 23. On the other hand, according to this embodiment, when the laser chamber 12 is evacuated, the high voltage power source 23 is horizontally moved by the power source frame 77, whereby the lift is unnecessary.

FIG. 13 shows an example in which the amplifier 111 is mounted on the upper base plate 36A in the fifth embodiment. When the high voltage power source 23 for the amplifier 111 is larger than the high voltage power source 23 for the seed laser unit 11, this constitution eliminates the need for the lift for lifting the heavier high voltage power source 23, whereby the constitution is simplified. FIG. 14 shows an example in which both of the two seed laser unit 11 and amplifier 111 are placed in a vertical position in the fifth embodiment. Consequently, the need for the lift for lifting the high voltage power source 23 is completely eliminated, thereby enabling a simpler constitution. Incidentally, in such a constitution, it is recommended that auxiliary equipment such as a vacuum pump be provided on the lower base plate 36B.

Figure 16:
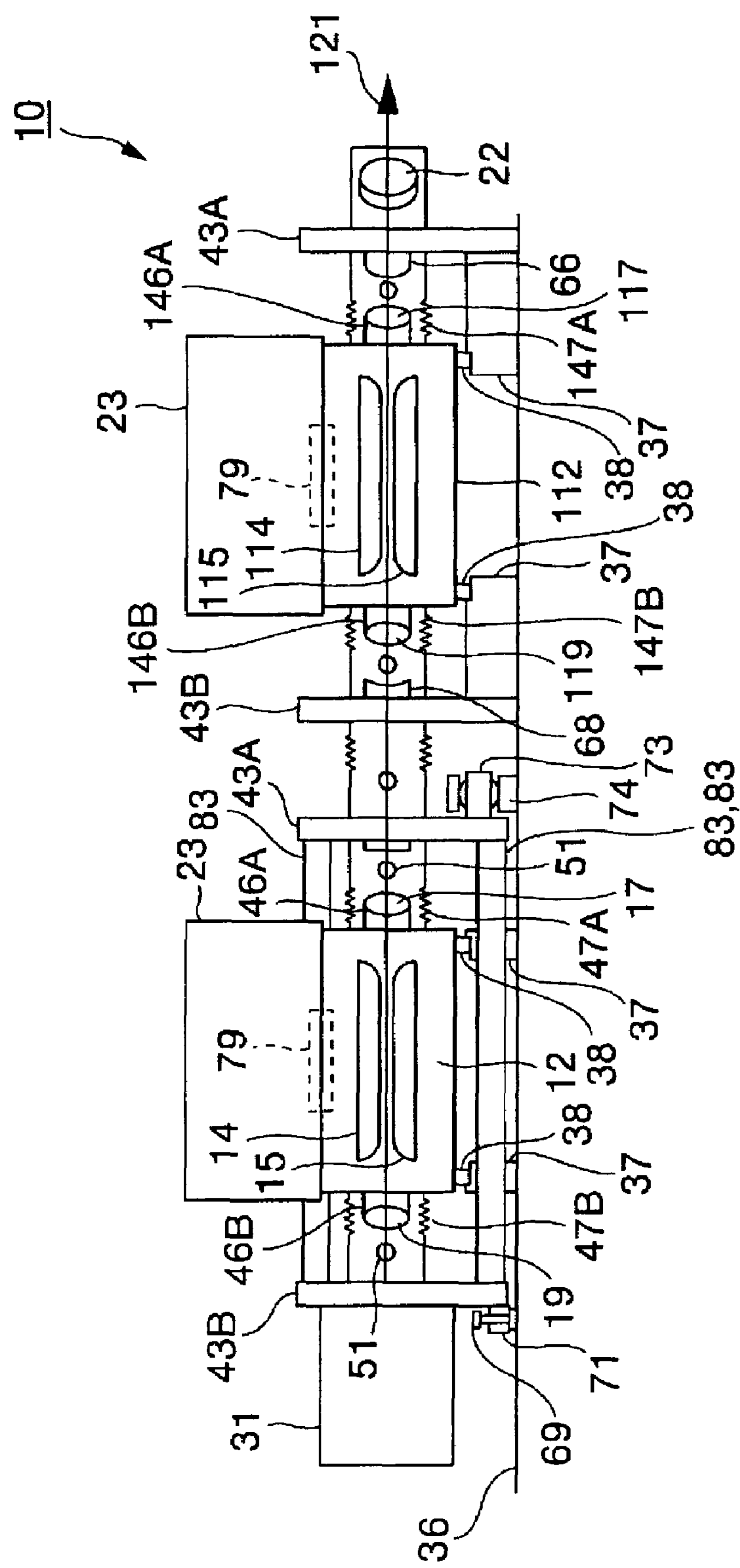
FIG. 16 is a front view of the laser device according to the sixth embodiment.
Figure 17:
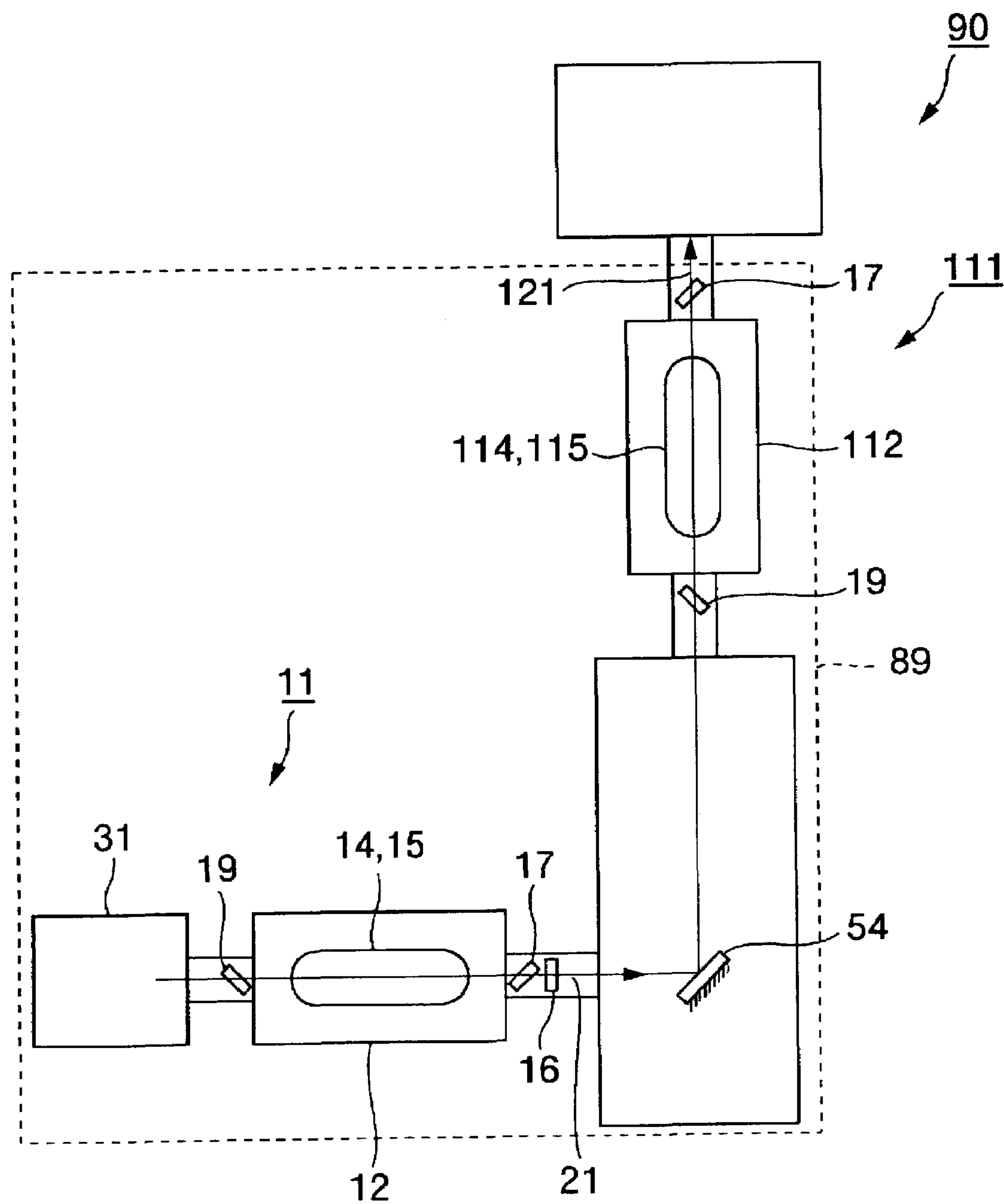
FIG. 17 is a block diagram of a laser device according to a prior art.

FIG. 15 shows a block diagram of the laser device 10 according to a sixth embodiment in plan view, and FIG. 16 shows a block diagram thereof in front view. In FIG. 15 and FIG. 16, the seed laser unit 11 and the amplifier 111 are arranged in series as shown in the second embodiment. The cavity plates 43A and 43B in the seed laser unit 11 are coupled by cavity rods 83 which are arranged parallel to each other and made of metal such as Invar with a very low thermal expansion coefficient. In the constitution of this embodiment, for example, one cavity rod and two cavity rods are arranged at its upper portion and lower portion, respectively.

A lower end portion of the rear cavity plate 43B is lifted off the base plate 36. A height adjusting bar 71 is fixed to a rear lower portion of the rear cavity plate 43B. A height adjusting bolt 69 is screwed into the height adjusting bar 71 in the substantially vertical direction. By changing the screwing amount of the height adjusting bolt 69, the height of a rear portion of the laser chamber 12 can be changed, and the direction of the optical axis of the seed laser light 21 in a vertical plane can be adjusted. Left and right adjusting bars 72 each of which a left and right adjusting bolt 70 is screwed into are fixed to the base plate 36. A tip portion of the left and right bolt 70 abuts on the height adjusting bar 71, and by changing the screwing amount of each of the left and right adjusting bolts 70, the rear portion of the laser chamber 12 can be moved with respect to the optical axis, and the direction of the optical axis of the seed laser light 21 in the horizontal plane can be adjusted.

A spherical bush 73 is fixed to a front lower portion of the front cavity plate 43A. A housing 74 into which the spherical bush 73 is fitted is fixed to the base plate 36, and when the aforementioned adjusting bolts 69 and 79 are moved, the laser chamber 12 rotates around this spherical bush 73. Consequently, it becomes possible to adjust the optical axis of the seed laser light 21 with respect to the amplifying chamber 112 and suitably amplify the seed laser light 21 in the amplifying chamber 112.

As explained above, according to the present invention, in the injection locking type of laser device 10, the chambers 12 and 112 of the seed laser unit 11 and the amplifier 111 can be drawn out in the same direction. Therefore, the worker need not move during maintenance, whereby labor saving in maintenance is achieved. Moreover, the installation area in which the laser device 10 is installed is reduced, leading to more compact equipment. Incidentally, the above explanation is made with the injection locking type of laser device 10 as an example, but the same explanation is also applicable to the MOPA type of laser device 10 which does not include the convex mirror 66 nor the concave mirror 68 with the hole. Further, although the example in which the seed laser light 21 is band-narrowed by the grating 33 is described, the present invention is also applicable to a case where it is band-narrowed by etalon or a case where it is single-lined by a dispersing prism. Furthermore, although the explanation is made with the fluorine molecular laser device 10 as an example, the present invention is also applicable to an excimer laser device such as a KrF or ArF laser device.

Embodiments and combinations thereof according to the injection locking type or MOPA type of gas laser device of the present invention based on the aforementioned detailed embodiments will be cited as follows. However, the following is only a part and does not limit other contents and combinations. Just for reference, regarding components, reference numerals in the drawings will be mentioned.

(1) First constitution: A gas laser device including a seed laser unit (11) for exciting a laser gas inside a laser chamber (12) and oscillating seed laser light (21) and an amplifier (111) for exciting a laser gas inside an amplifying chamber (112) and amplifying pulse energy of the seed laser light (21), and allowing a worker to perform maintenance for the laser chamber (12) and the amplifying chamber (112) from the same side.

(2) Second constitution: A gas laser device including a seed laser unit (11) for exciting a laser gas inside a laser chamber (12) and oscillating seed laser light (21) and an amplifier (111) for exciting a laser gas inside an amplifying chamber (112) and amplifying pulse energy of the seed laser light (21), and allowing the laser chamber (12) and the amplifying chamber (112) to be evacuated to the same side with respect to an optical axis of the seed laser light (21).

(3) Third constitution: An injection locking type or MOPA type of gas laser device characterized in that, in the gas laser device of the second constitution, rails (37, 37) for mounting the laser chamber (12) and the amplifying chamber (112) thereon respectively are further provided, and the laser chamber (12) and the amplifying chamber (112) are evacuated along the rails (37, 37).

(4) Fourth constitution: In the gas laser device of the third constitution, the laser chamber (12) and the amplifying chamber (112) are respectively mounted on the rails (37, 37) via rotatable rollers (38, 38).

(5) Fifth constitution: In the gas laser device of the third or fourth constitution, the rails (37, 37) are placed almost perpendicularly to the optical axis of the seed laser light (21).

(6) Sixth constitution: In the gas laser device of any one of the third to fifth constitutions, the laser chamber (12) and the amplifying chamber (112) are mounted on the same rails (37, 37).

(7) Seventh constitution: In the gas laser device of any one of the third to fifth constitutions, the laser chamber (12) and the amplifying chamber (112) are arranged vertically to each other.

(8) Eighth constitution: In the gas laser device of any one of the third to fifth constitutions, at least one of the laser chamber (12) and the amplifying chamber (112) is placed so that the emitted laser light (21, 121) is oriented in a vertical direction.

(9) Ninth constitution: In the gas laser device of any one of the first to eighth constitutions, an optical path cover (52) for covering an optical path space (53) which the seed laser light (21) passes through and a purge mechanism for filling the interior of the optical path space (53) with a clean purge gas with low reactivity are further provided.

(10) Tenth constitution: In the gas laser device of the ninth constitution, optical axis adjusting means for adjusting the optical axis of the seed laser light (21) is further provided.

(11) Eleventh constitution: In the gas laser device of the tenth constitution, the optical axis adjusting means is an optical path mirror (54) for reflecting the seed laser light (21).

(12) Twelfth constitution: In the gas laser device of the eleventh constitution, manipulating means (61) for manipulating an angle of the optical path mirror (54) from outside the optical path space (53) and sealing means (62) for preventing outside air from being mixed into the optical path space (53) when the manipulating means (61) is manipulated are further provided.

(13) Thirteenth constitution: In the gas laser device of the tenth constitution, the optical axis adjusting means is moving means (69, 70) for moving cavity plates (43A, 43B) for fixing a resonator of the laser chamber (12).

What is claimed is:

1. A laser device, comprising:

a seed laser unit for exciting a laser gas inside a laser chamber and oscillating seed laser light; and an amplifier for exciting a laser gas inside an amplifying chamber and amplifying pulse energy of the seed laser light, means for moving both said laser chamber and said amplifying chamber from a position in the laser device to be evacuated to a same side of the laser device with respect to an optical axis of the seed laser light.

2. The laser device according to claim 1, wherein said moving means comprises rails for mounting said laser chamber and said amplifying chamber thereon respectively, and wherein said laser chamber and said amplifying chamber are evacuated along said rails.

3. The laser device according to claim 2, wherein said rails are placed substantially perpendicular to the optical axis of the seed laser light.

4. The laser device according to claim 2, wherein said laser chamber and said amplifying chamber are mounted on said rails via rotatable rollers.

5. The laser device according to claim 4, wherein said rails are placed substantially perpendicular to the optical axis of the seed laser light.

6. The laser device according to claim 4, wherein said laser chamber and said amplifying chamber are mounted on the same rails.

7. The laser device according to claim 4, wherein said laser chamber and said amplifying chamber are arranged vertically with respect to each other.

8. The laser device according to claim 4, wherein at least one of said laser chamber and said amplifying chamber is oriented such that emitted laser light is oriented in a vertical direction.

9. The laser device according to claim 1, further comprising:

an optical path cover for covering an optical path space which the seed laser light passes through; and a purge mechanism for filling an interior of said optical path space with a clean inert gas.

10. The laser device according to claim 9, further comprising:

optical axis adjusting means for adjusting the optical axis of the seed laser light.

11. The laser device according to claim 10, wherein said optical axis adjusting means comprises an optical path mirror for reflecting the seed laser light.

12. The laser device according to claim 11, further comprising:

manipulating means for changing an angle of said optical path mirror, one end of said manipulating means being disposed outside of said optical path and the other end of said manipulating means being in contact with said optical path mirror in said optical path space and being movable in response to movement of said one end; and sealing means for preventing outside air from being mixed into said optical path space when said manipulating means is manipulated.

13. The laser device according to claim 10, wherein said optical axis adjusting means comprises moving means for moving said laser chamber by moving uprightly standing plates connected to a resonator of said laser chamber.

* * * * *